(12) United States Patent
Zhou et al.

(10) Patent No.: US 7,589,967 B2
(45) Date of Patent: Sep. 15, 2009

(54) HEAT DISSIPATION DEVICE

(75) Inventors: Shi-Wen Zhou, Shenzhen (CN); Guo Chen, Shenzhen (CN); Peng Liu, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 220 days.

(21) Appl. No.: 11/566,025

(22) Filed: Dec. 1, 2006

(65) Prior Publication Data

US 2008/0130228 A1 Jun. 5, 2008

(51) Int. Cl.
*H05K 7/20* (2006.01)
*F28F 7/00* (2006.01)
*H01L 23/34* (2006.01)

(52) U.S. Cl. .................... 361/697; 361/695; 361/710; 165/80.3; 165/185; 174/16.3; 257/718; 257/719; 257/722

(58) Field of Classification Search ............... 361/695, 361/697; 165/80.2, 80.3; 174/16.3; 257/718–719, 257/721–722
See application file for complete search history.

(56) References Cited

U.S. PATENT DOCUMENTS

| 6,401,806 B1 * | 6/2002 | Lee et al. .................. 165/80.3 |
|---|---|---|
| 6,407,919 B1 * | 6/2002 | Chou ......................... 361/697 |
| 6,923,619 B2 | 8/2005 | Fedoseyev et al. |
| 6,969,234 B2 | 11/2005 | Lin |
| 7,046,515 B1 | 5/2006 | Wyatt et al. |
| 7,130,192 B2 | 10/2006 | Wang et al. |
| 2004/0261976 A1 * | 12/2004 | Watanabe et al. ............. 165/87 |
| 2005/0270740 A1 * | 12/2005 | Tai et al. ..................... 361/690 |

FOREIGN PATENT DOCUMENTS

| CN | 2658817 Y | 11/2004 |
|---|---|---|
| CN | 2746524 Y | 12/2005 |
| TW | M259219 | 3/2005 |
| TW | M292733 | 6/2006 |
| TW | I267347 | 11/2006 |

* cited by examiner

*Primary Examiner*—Zachary M Pape
(74) *Attorney, Agent, or Firm*—Frank R. Niranjan

(57) ABSTRACT

A heat dissipation device includes a heat sink (10) for contacting a heat-generating component and a fan (20) mounted to the heat sink. The fan includes a frame (22) and a motor (24) received in the frame. The fan has an intake. The frame has a top level and a bottom level. An airflow is generated by the fan and flows through the heat sink. An anti-backflow plate (30) is mounted between the top level and the bottom level of the fan. The anti-backflow plate extends outwardly and beyond an extremity of the heat sink to prevent the airflow flowing through the heat sink from entering the intake of the fan.

14 Claims, 4 Drawing Sheets

HEAT DISSIPATION DEVICE

BACKGROUND OF THE INVENTION

1. Field of the Invention

The present invention relates to a heat dissipation device, and more particularly to a heat dissipation device having an anti-backflow plate for achieving greater heat dissipation efficiency.

2. Description of Related Art

As computer technology continues to advance, electronic components such as central processing units (CPUs) are being made to operate at ever-increasing speeds and with increasing functional capabilities. When a CPU operates at a high speed in a computer enclosure, its temperature usually increases greatly. It is desirable to dissipate the heat generated by the CPU quickly.

Conventionally, a heat dissipation device is used to dissipate heat generated by the CPU. The CPU is mounted on a printed circuit board. The heat dissipation device comprises a heat sink and a fan disposed on the heat sink. The fan produces an airflow which is blown downward onto the heat sink. The airflow is prone to being deflected back upwards by the printed circuit board, which causes substantial heat backflow; this adversely affects the dissipation of the heat from the heat sink. Accordingly, the conventional heat dissipation device cannot dissipate heat quickly and the heat dissipation efficiency of the conventional heat dissipation device is relatively low.

What is needed, therefore, is a heat dissipation device with greater heat dissipation efficiency.

SUMMARY OF THE INVENTION

A heat dissipation device in accordance with a preferred embodiment of the present invention includes a heat sink for contacting a heat-generating component and a fan mounted to the heat sink. The fan includes a frame and a motor received in the frame. The fan has an intake. The frame has a top level and a bottom level. Airflow is generated by the fan and flows through the heat sink. An anti-backflow plate is mounted between the top level and the bottom level of the fan. The anti-backflow plate extends outwardly and beyond an extremity of the heat sink to prevent the airflow which has been driven by the fan to flow through the heat sink, be heated by the heat sink, and bounce off a printed circuit board from reaching the intake of the fan and entering the fan via the intake thereof.

Other advantages and novel features will become more apparent from the following detailed description of preferred embodiments when taken in conjunction with the accompanying drawings, in which:

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
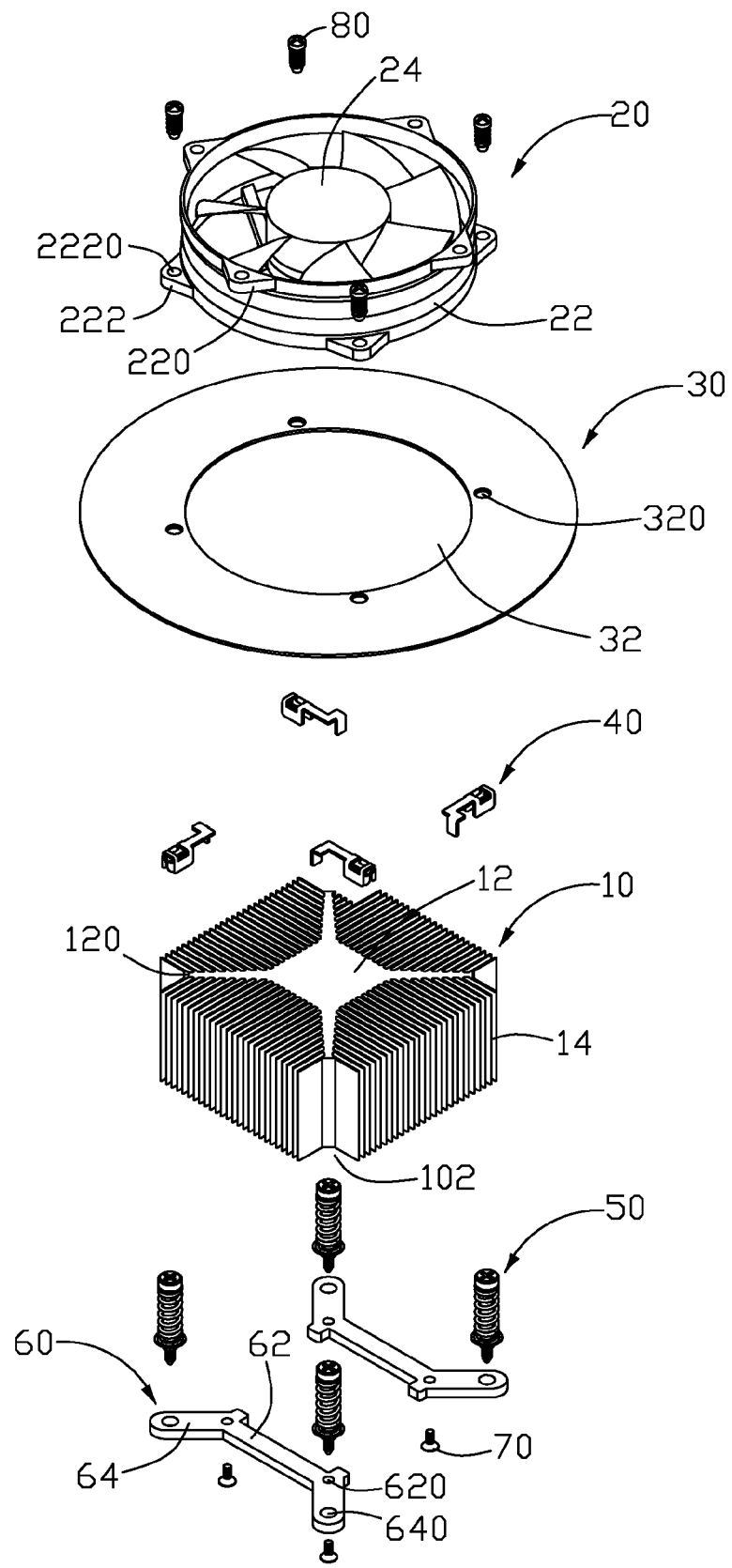
FIG. 1 is an exploded, isometric view of a heat dissipation device in accordance with a preferred embodiment of the present invention.
Figure 2:
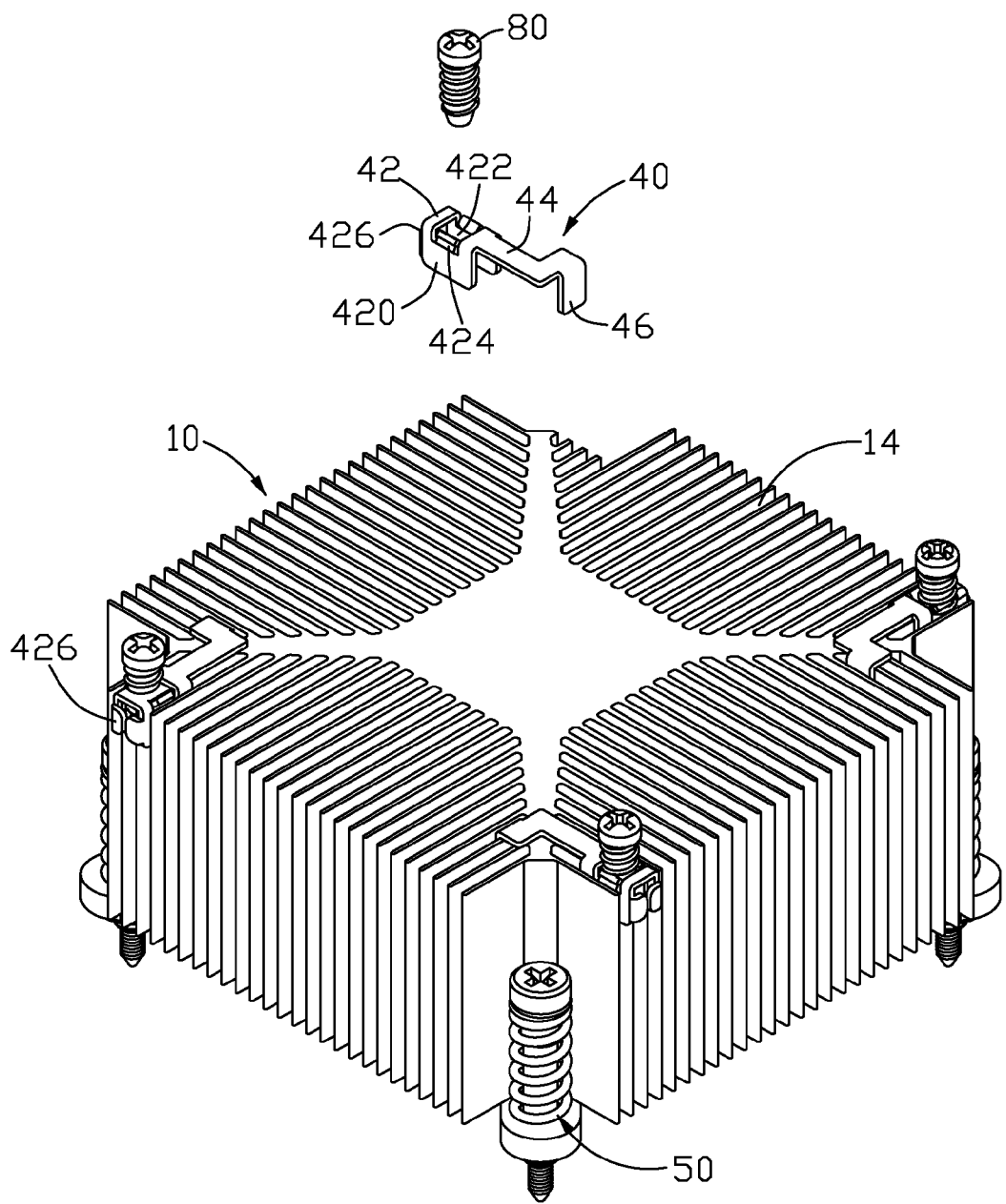
FIG. 2 is a partially exploded view of the heat dissipation device of FIG. 1, wherein a fan and an anti-backflow plate are removed.

Referring to FIGS. 1-2, a heat dissipation device in accordance with a preferred embodiment of the invention is mounted on a printed circuit board (not shown) for dissipating heat generated by a heat-generating component (not shown) mounted on the printed circuit board. The heat dissipation device comprises a heat sink 10, a fan 20 and an anti-backflow plate 30 mounted on the fan 20. The anti-backflow plate 30 prevents an airflow generated by the fan 20 and deflected back upwardly from the printed circuit board from backflow to the fan, thereby improving efficiency of the heat dissipation device.

The heat sink 10 comprises a solid core 12 shaped similar to a cube and four symmetrical branches 120 extending outwardly from four corners of the core 12. The solid core 12 is in contact with the heat-generating component and has an axis substantially perpendicular to the heat-generating component. A plurality of fins 14 project outwardly from side surfaces of the core 12 and the branches 120. The fins 14 can be divided into four groups oriented at four different directions. Four side surfaces of the core 12 and the four branches 120 form four regions. Each group of the fins 14 is formed in a corresponding region. Two neighboring groups of the fins 14 are oriented perpendicularly to each other. A mounting space 102 is formed between two neighboring groups of the fins 14, for receiving a corresponding one of fasteners 50 therein. Two adjacent outermost fins 14 of the two neighboring groups of the fins 14 form an angle of 90 degrees therebetween. A pair of mounting brackets 60 are attached to a bottom of the heat sink 10. Each mounting bracket 60 comprises a base portion 62 corresponding to a front/rear edge of a bottom of the core 12 of the heat sink 10, and a pair of ears 64 extending outwardly and horizontally from ends of the base portion 62. A pair of mounting holes 620 are defined at a joint of the base portion 62 and the ears 64. A pair of corresponding screws 70 extend through the mounting holes 620 and threadedly engage with the heat sink 10, thus attaching the mounting brackets 60 to the heat sink 10. The ears 64 correspond to the braches 120 of the heat sink 10. Each ear 64 extends into the mounting space 102 of the heat sink 10. A through hole 640 is defined in a free end of the ear 64 for providing passage of the fastener 50.

Also referring to FIG. 2, four holders 40 are mounted on the heat sink 10 for mounting the fan 20 and the anti-backflow plate 30 onto the heat sink 10. The holder 40 comprises a retaining body 42 for clasping two adjacent fins 14 in a first group of the fins 14, an elongated L-shaped connecting portion 44 extending integrally and horizontally from the retaining body 42, and a block portion 46 extending from a free end of and perpendicular to the connecting portion 44 for clasping a fin 14 disposed at a second group of the fins 14 adjacent to the first group of the fins 14. The retaining body 42 comprises a pair of opposite lateral walls 420 with inner surfaces thereof abutting against sides of the two adjacent fins 14 facing opposite directions. The retaining body 42 defines an opening 422 adjacent to top extremities of the two adjacent fins 14 and communicating with a space between the two adjacent fins 14. A width between the opposite inner surfaces of the lateral walls 420 is substantially the same as that between the opposite outer surfaces of the two adjacent fins 14 such that the lateral walls 420 can clasp the two adjacent fins 14 therebetween for preventing the two adjacent fins 14 from being deformed outwardly during screwing of a self-tapping screw 80 into the space between the two adjacent fins 14. A pair of spring arms 424 extend upwardly from upper edges of the lateral walls 420 at the opening 422 of the retaining body 42 for facilitating the insertion of the self-tapping screw 80. The retaining body 26 further comprises a pair of latches 426 extending inwardly from an end of the lateral walls 420 and perpendicular to the lateral walls 420 at a position remote from the block portion 46, for abutting against outer ends of the adjacent fins 14.

The anti-backflow plate 30 has an annular configuration. The anti-backflow plate 30 has a hole 32 receiving the fan 20 therein, thereby mounting the anti-backflow plate 30 to the fan 20. A plurality of mounting holes 320 are defined in the anti-backflow plate 30 and symmetrically around the hole 32, corresponding to the openings 422 of the retaining bodies 42 of the holders 40, respectively. The anti-backflow plate 30 extends outwardly and beyond an extremity of the heat sink 10.

The fan 20 comprises a frame 22 and a motor 24 received in the frame 22. The frame 22 has a circular configuration. The frame 22 has a top level and a bottom level parallel to the top level. The motor 24 has an axis parallel to the axis of the core 12 of the heat sink 10. The fan 20 has an intake (not labeled) and an outtake (not labeled) parallel to the intake. An extending direction of the intake of the fan 20 is parallel to the axis of the motor 24. First and second bulges 220, 222 extend horizontally from upper and lower edges of the frame 22. The first and second bulges 220, 222 are distributed in alternating fashion. A through hole 2220 corresponding to the mounting hole 320 is defined in each second bulge 222, for permitting passage of the self-tapping screw 80.

Figure 3:
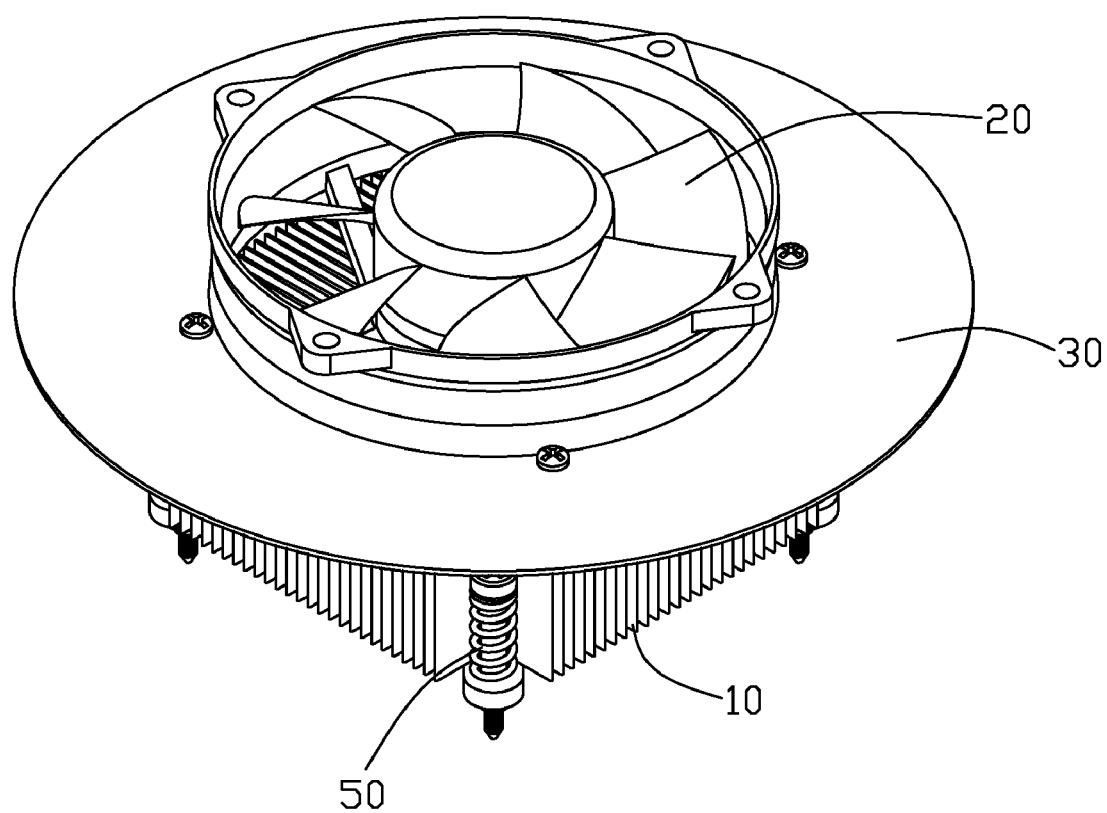
FIG. 3 is an assembled view of the heat dissipation device of FIG. 1.
Figure 4:
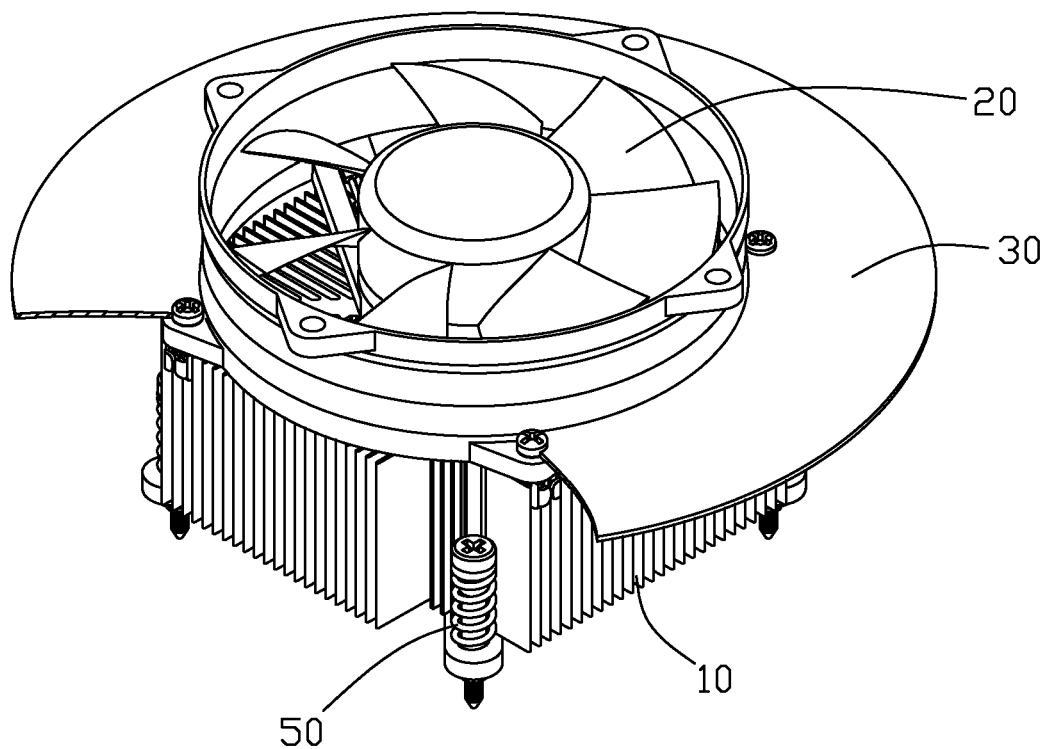
FIG. 4 is a view similar to FIG. 3, wherein the anti-backflow plate is partly cutaway.

Referring to FIGS. 3-4, in assembly, the anti-backflow plate 30 is mounted on the second bulges 222 of the fan 20. The self-tapping screws 80 extend through the mounting holes 320 of the anti-backflow plate 30, the through holes 2220 of the fan 20, the openings 422 of the holders 40 in series and into the spaces between the two adjacent fins 14 and threadedly engage with the two adjacent fins 14 by self-tapping, thereby securely mounting the anti-backflow plate 30 and the fan 20 to the heat sink 10.

Alternatively, the anti-backflow plate 30 can be directly mounted around a circumferential periphery of the frame 22 of the fan 20. The anti-backflow plate 30 also can be mounted below a bottom of the fan 20. Thus the anti-backflow plate 30 can be mounted between the top level and the bottom level of the frame 22 of the fan 20 to prevent the airflow which has been driven by the fan 20 to flow through the heat sink 10, be heated by the heat sink 10, and bounce off the printed circuit board from reaching the intake of the fan 20 and entering the fan 20 via the intake thereof.

In operation of the heat dissipation device of the preferred embodiment of the invention, the fan 20 blows airflow downwards along channels defined between the fins 14 of the heat sink 10, heat originating from the heat-generating component is absorbed by the core 12 of the heat sink 10 and then transferred to the fins 14 to be dissipated to ambient air from an outlet (not shown) defined in a computer enclosure (not shown) by the airflow directly. During the operation of the heat dissipation device, even if the heated airflow flowing through the heat sink 10 is deflected by the printed circuit board, the heated airflow will be deflected by the anti-backflow plate 30 in an opposing direction. Thus, the heated airflow cannot enter the intake of the fan 20. The anti-backflow plate 30 thus effectively prevents the airflow generated by the fan 20 from backflow and promotes heat-dissipating efficiency.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
   a heat sink for contacting a heat-generating component, the heat sink comprising a solid core having an axis substantially perpendicular to the heat-generating component, and a plurality of fins outwardly and radially extending from the core;
   a plurality of holders connected with fins of the heat sink;
   a fan comprising a frame and a motor received in the frame, the fan having an intake, the frame having a top level and a bottom level, an airflow generated by the fan and flowing through the heat sink; and
   an anti-backflow plate mounted between the top level and the bottom level of the fan, the anti-backflow plate extending outwardly and beyond an extremity of the heat sink to prevent the airflow flowing through the heat sink from entering the intake of the fan;
   wherein each of the holders defines an opening communicating with a channel defined between two of the fins, and a plurality of self-tapping screws extend through the anti-backflow plate, the fan and the openings of the holders in series to threadedly engage with corresponding fins.

2. The heat dissipation device as claimed in claim 1, wherein the anti-backflow plate has an annular configuration.

3. The heat dissipation device as claimed in claim 1, wherein the anti-backflow plate defines a hole receiving the fan therein.

4. The heat dissipation device as claimed in claim 1, wherein each of the holders comprises a retaining body sandwiching two adjacent fins therein.

5. The heat dissipation device as claimed in claim 4, wherein the holder further comprises a block portion engaging with one of the fins other than the two adjacent fins.

6. The heat dissipation device as claimed in claim 5, wherein the two adjacent fins are oriented at a first direction and the one of the fins is oriented in a second direction different from the first direction.

7. The heat dissipation device as claimed in claim 6, wherein the first direction is perpendicular to the second direction.

8. The heat dissipation device as claimed in claim 4, wherein each holder has a pair of spring arms located above the retaining body for clamping a corresponding self-tapping screw therebetween.

9. The heat dissipation device as claimed in claim 1, wherein a plurality of branches corresponding to the holders extend outwardly from corners of the core, and the fins project from side surfaces of the core and the branches.

10. The heat dissipation device as claimed in claim 9, wherein a pair of mounting brackets are attached to a bottom of the heat sink.

11. The heat dissipation device as claimed in claim 10, wherein a plurality of fasteners extends through the mounting brackets to mount the heat dissipation device onto a board.

12. The heat dissipation device as claimed in claim 1, wherein first and second bulges extend horizontally from upper and lower edges of the frame.

13. The heat dissipation device as claimed in claim 12, wherein the anti-backflow plate is located above the second bulges of the fan.

14. The heat dissipation device as claimed in claim 12, wherein the anti-backflow plate is mounted between a bottom of the fan and a top of the heat sink.

* * * * *